(12) United States Patent
Gore et al.

(10) Patent No.: US 9,800,279 B2
(45) Date of Patent: Oct. 24, 2017

(54) METHOD AND APPARATUS FOR AUTOMATIC GAIN CONTROL IN WIRELESS RECEIVER

(71) Applicant: SAMSUNG ELECTRONICS CO., LTD., Suwon-si (KR)

(72) Inventors: Ashutosh Deepak Gore, Bangalore (IN); Jinesh P. Nair, Bangalore (IN); Chang Soon Park, Chungju-si (KR); Kiran Bynam, Bangalore (IN); Seok Ju Yun, Hwaseong-si (KR); Young Jun Hong, Seoul (KR)

(73) Assignee: Samsung ELectronics Co., Ltd., Suwon-si (KR)

( * ) Notice: Subject to any disclaimer, the term of this patent is extended or adjusted under 35 U.S.C. 154(b) by 0 days.

(21) Appl. No.: 15/044,398

(22) Filed: Feb. 16, 2016

(65) Prior Publication Data
US 2016/0241212 A1 Aug. 18, 2016

(30) Foreign Application Priority Data

Feb. 16, 2015 (IN) .............................. 754/CHE/2015
Sep. 22, 2015 (KR) ........................ 10-2015-0134101

(51) Int. Cl.
*H04B 1/04* (2006.01)
*H03G 3/00* (2006.01)
*H04B 1/16* (2006.01)
*H03G 3/30* (2006.01)

(52) U.S. Cl.
CPC ................. *H04B 1/16* (2013.01); *H03G 3/00* (2013.01); *H03G 3/3068* (2013.01); *H03G 3/3078* (2013.01); *H03G 3/3036* (2013.01); *H04B 2001/0408* (2013.01)

(58) Field of Classification Search
CPC ...... H03G 3/00; H03G 3/3036; H03G 3/3068; H03G 3/3078; H04L 27/3809; H04B 1/16; H04B 2001/0408
See application file for complete search history.

(56) References Cited

U.S. PATENT DOCUMENTS

| 2002/0163979 A1* | 11/2002 | Takatz | H03G 3/3052 375/345 |
| 2003/0099287 A1* | 5/2003 | Arambepola | H03G 3/345 375/227 |
| 2005/0239427 A1* | 10/2005 | Inoue | H03G 3/001 455/232.1 |
| 2006/0034401 A1* | 2/2006 | Cho | H03G 3/001 375/345 |

(Continued)

FOREIGN PATENT DOCUMENTS

| KR | 10-0738397 B1 | 7/2007 |
| KR | 10-0818002 B1 | 3/2008 |

*Primary Examiner* — Jean B Corrielus
(74) *Attorney, Agent, or Firm* — NSIP Law

(57) ABSTRACT

Examples provide a method of performing automatic gain control (AGC) in a wireless receiver, the method including computing, by an energy detection (ED) circuit, a variance in an output signal of an analog-to-digital converter (ADC), and activating, by the ED circuit, an AGC circuit to adjust a gain of at least one component in a radio frequency integrated chip (RFIC) in response to the variance exceeding a threshold. Examples also provide for a wireless receiver that implements such a method.

16 Claims, 12 Drawing Sheets

(56) References Cited

U.S. PATENT DOCUMENTS

| | | | |
|---|---|---|---|
| 2009/0079611 A1* | 3/2009 | Hwang | H03M 1/18 341/155 |
| 2010/0118917 A1* | 5/2010 | Oh | H04B 1/71637 375/130 |
| 2012/0252389 A1 | 10/2012 | Krishnan et al. | |
| 2012/0288043 A1 | 11/2012 | Chen et al. | |
| 2014/0080549 A1* | 3/2014 | Li | H04W 52/52 455/571 |
| 2014/0340153 A1* | 11/2014 | Wilhelmsson | H03G 3/3078 330/278 |
| 2015/0207529 A1* | 7/2015 | Gander | H03M 1/185 455/234.1 |

* cited by examiner

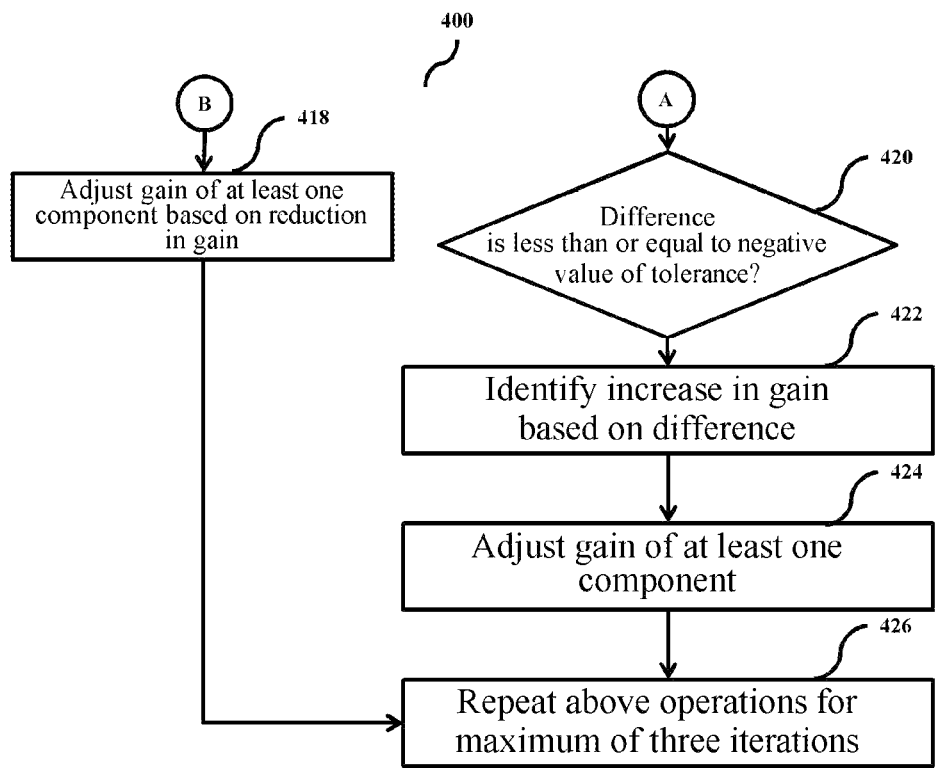

SIR at receiving antenna(dB)

METHOD AND APPARATUS FOR AUTOMATIC GAIN CONTROL IN WIRELESS RECEIVER

CROSS-REFERENCE TO RELATED APPLICATION(S)

This application claims the benefit under 35 USC 119(a) of Indian Patent Application No. 754/CHE/2015 filed on Feb. 16, 2015 in the Indian Patent Office, and Korean Patent Application No. 10-2015-0134101 filed on Sep. 22, 2015 in the Korean Intellectual Property Office, the entire disclosures of which are incorporated herein by reference for all purposes.

BACKGROUND

1. Field

The following description relates to ultra low power (ULP) wireless communications. The following description also relates to a method and apparatus for performing automatic gain control (AGC) in a ULP wireless receiver.

2. Description of Related Art

With the development of ULP wireless communications in application areas such as, for example, body area networks, wireless personal area networks, and wireless sensor networks, the design challenges in a ULP wireless receiver have increased. In such applications, the ULP wireless receiver provides low data rates, for example, less than 1 megabit per second (Mbps), while operating over short distances, for example, up to 50 meters, with minimal power consumption.

The ULP wireless receiver potentially experiences a high variation, for example, up to 100 decibels (dB), in received signal power at an antenna of the ULP wireless receiver due to multipath and shadowing effects. In the ULP wireless receiver, the operation and design of an AGC circuit is significant for successful demodulation of signals received at the ULP receiver. Generally, the ULP wireless receiver uses multiple variable gain stages between the antenna and an analog-to-digital converter (ADC). For error-free reception of packets and successful baseband demodulation, an output signal of the ADC has a relatively high signal-to-noise ratio (SNR) and an adequate amplitude variation. In response to incorrect setting of the variable gain stages, the output signal of the ADC saturates frequently or has a low SNR, resulting in unsuccessful demodulation.

In existing AGC designs for high throughput technologies such as, for example, wireless local area network (WLAN) communication and 2G/3G/4G cellular coherent wireless receivers, multiple inputs obtained from multiple observation points, for example, outputs of the ADC, an adjacent channel rejection filter, and a peak detect filter, are used. The operation of the AGC in these examples is complex due to stringent requirements on a convergence time, and aspects related to processing of data from the multiple observation points.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of performing automatic gain control (AGO) in a wireless receiver includes computing, by an energy detection (ED) circuit, a variance in an output signal of an analog-to-digital converter (ADC), and activating, by the ED circuit, an AGC circuit to adjust a gain of a component in a radio frequency integrated chip (RFIC) in response to the variance exceeding a threshold.

The method may further include computing, by the AGC circuit, an output power of the output signal, and adjusting, by the AGC circuit the gain of the component based on a relationship between the output power and a signal-to-noise ratio (SNR) of a received signal.

The adjusting may include calculating a difference between the output power and a target power of the output signal, determining whether the difference exceeds a tolerance of the target power, identifying a reduction in the gain based on a result of the determining, and adjusting the gain of the component based on the reduction in the gain.

The identifying may include mapping a power difference interval to the reduction in the gain.

The mapping may include obtaining a power difference interval corresponding to an SNR interval, subtracting an intermediate value of the SNR interval from a target SNR, and identifying a reduction in a gain or the power difference interval based on a result of the subtracting.

The method may further include determining whether the difference exceeds a tolerance of the target power, and identifying an increase in the gain based on the difference, and adjusting the gain of the component based on the increase in the gain.

The adjusting may include computing an unquantized gain by adding a sum of current quantized gains and an identified reduction in the gain.

The computing of the unquantized gain may include adding a variable gain of the component and a fixed gain of the component.

The method may further include assigning a priority to the component to reduce a noise figure, and selecting the variable gain of the component based on the priority.

The component with a variable gain may include at least one of a low noise amplifier (LNA), a mixer, a filter, a programmable gain amplifier (PGA), and an envelope detector.

In another general aspect, a wireless receiver includes an energy detection (ED) circuit configured to compute a variance in an output signal of an analog-to-digital converter (ADC), and to activate an automatic gain control (AGO) circuit in response to the variance exceeding a threshold, wherein the AGC circuit is configured to adjust a gain of a component in a radio frequency integrated chip (RFIC).

The AGC circuit may be further configured to compute an output power of the output signal, and adjust the gain of the component based on a relationship between the output power and a signal-to-noise ratio (SNR) of a received signal.

The AGC circuit may be further configured to calculate a difference between the output power and a target power of the output signal, determine whether the difference exceeds a tolerance of the target power, identify a reduction in the gain based on a result of the determining, and adjust the gain of the component based on the reduction in the gain.

The AGC circuit may be configured to identify the reduction in the gain by mapping a power difference interval to the reduction in the gain.

The AGC circuit may be further configured to obtain a power difference interval corresponding to an SNR interval, subtract an intermediate value of the SNR interval from a target SNR, and identify a reduction in a gain for the power difference interval based on a result of the subtracting.

The AGC circuit may be further configured to determine whether the difference exceeds a tolerance of the target power, identify an increase in the gain based on the difference, and adjust the gain of the component based on the increase in the gain.

The AGC circuit may be further configured to compute an unquantized gain by adding a sum of current quantized gains and an identified reduction in the gain.

The AGC circuit may be configured to compute the unquantized gain by adding a variable gain of the component and a fixed gain of the component.

The AGC circuit may be configured to assign a priority to the component to reduce a noise figure, and select the variable gain of the component based on the priority.

In another general aspect, a non-transitory computer-readable storage medium stores instructions for causing computing hardware to implement a method including computing, by an energy detection (ED) circuit, a variance in an output signal of an analog-to-digital converter (ADC), and activating, by the ED circuit, an AGC circuit to adjust a gain of a component in a radio frequency integrated chip (RFIC) in response to the variance exceeding a threshold.

Other features and aspects will be apparent from the following detailed description, the drawings, and the claims.

BRIEF DESCRIPTION OF THE DRAWINGS

FIGS. 4A and 4B are flowcharts illustrating a method of performing AGC in a ULP wireless receiver in accordance with an example.

Figure 1:
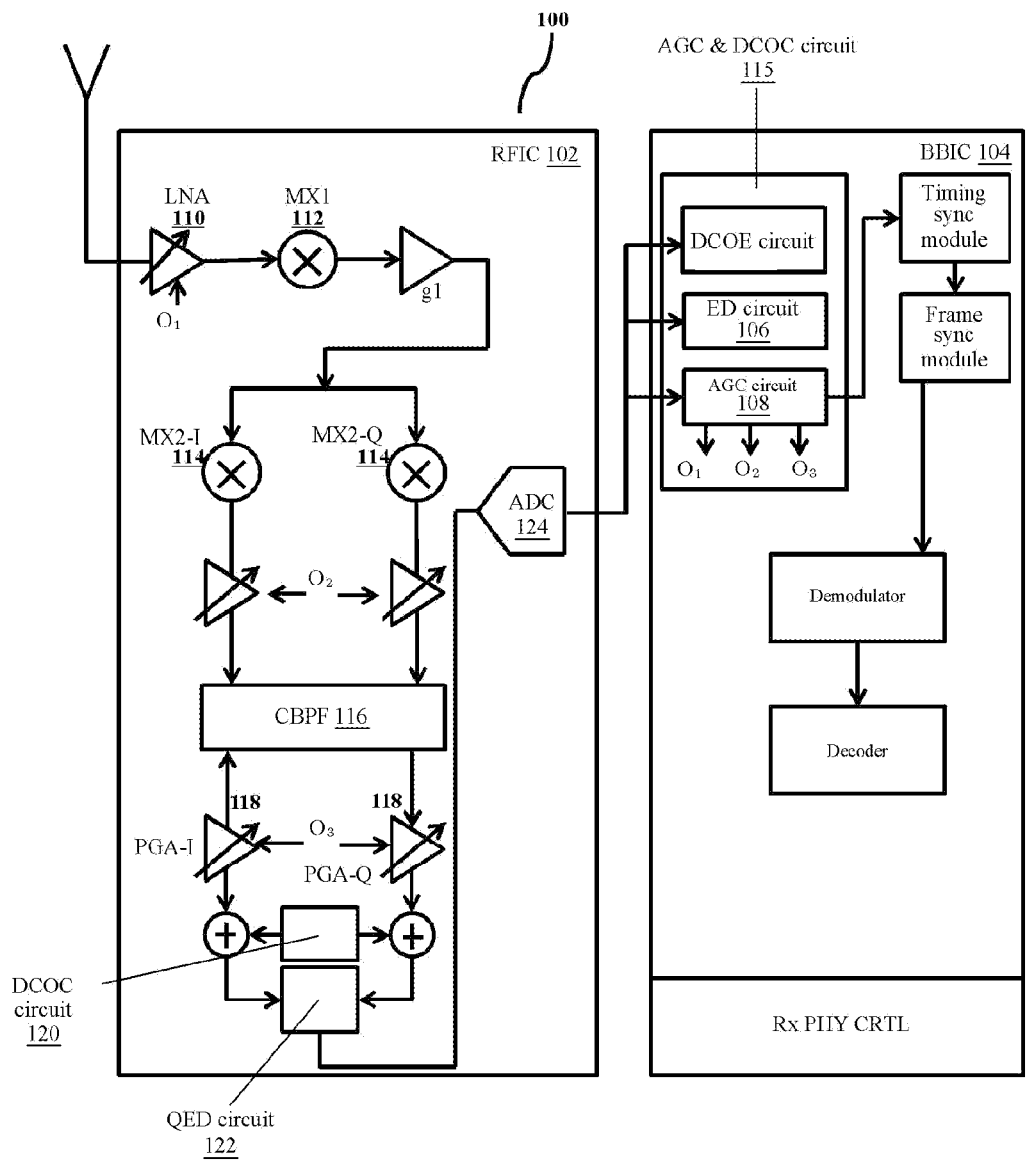
FIG. 1 is a diagram illustrating an ultra low power (ULP) wireless receiver in accordance with an example.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein are possibly embodied in different forms, and are not to be construed as being limited to the examples described herein. Rather, the examples described herein have been provided so that this disclosure is thorough and complete, and conveys the full scope of the disclosure to one of ordinary skill in the art.

Hereinafter, reference is now made in detail to examples with reference to the accompanying drawings, wherein like reference numerals refer to like elements throughout.

The terminology used herein is for the purpose of describing particular examples only and is not intended to be limiting of the examples. As used herein, the singular forms "a", "an", and "the" are intended to include the plural forms as well, unless the context clearly indicates otherwise. It is to be further understood that the terms "include/comprise" and/or "have" when used in this specification, specify the presence of stated features, integers, steps, operations, elements, components, and/or combinations thereof, but do not preclude the presence or addition of one or more other features, numbers, steps, operations, elements, components, and/or groups thereof.

Unless otherwise defined, all terms including technical and scientific terms used herein have the same meaning as commonly understood by one of ordinary skill in the art to which examples belong. It is to be further understood that terms, such as those defined in commonly-used dictionaries, are to be interpreted as having a meaning that is consistent with their meaning in the context of the relevant art and are not to be interpreted in an idealized or overly formal sense unless expressly so defined herein.

When describing the examples with reference to the accompanying drawings, like reference numerals refer to like constituent elements and a repeated description related thereto is omitted for brevity. When it is determined that a detailed description related to a related known function or configuration makes the purpose of the examples unnecessarily ambiguous in describing the examples, the detailed description is omitted here for clarity.

The examples set forth herein relate to a method and apparatus for performing automatic gain control (AGO) in an ultra low power (ULP) wireless receiver. The method includes computing, by an energy detection circuit, a variance in an output signal of an analog-to-digital converter (ADC). The method further includes activating, by the energy detection circuit, an AGC circuit to adjust a gain of at least one component in a radio frequency integrated chip (RFIC) in response to the variance exceeding a threshold. In response to the AGC circuit being activated, the method further includes computing an output power of the output signal, by the AGC circuit, and adjusting the gain of the at least one component. The gain of the at least one component is adjusted based on a relationship between the output power and a signal-to-noise ratio (SNR) of a signal received at an antenna of the ULP wireless receiver. A gain of the RFIC increases or decreases based on the relationship between a computed output voltage of the ADC and the received SNR. The proposed method allows successful demodulation of signals in a digital baseband by adjusting a gain of at least one component in the RFIC based on power measurements of the received output signal of the ADC. The output power is maintained close to a predetermined target power to ensure effective baseband demodulation. Such a proposed mechanism not only ensures that the output power is maintained close to the predetermined target power but also ensures that the received signal does not clip.

Unlike alternative methods, which require multiple observation points in the RFIC, the proposed method provides signal demodulation in a baseband using a single observation point.

Further, by adjusting the gain, subsequent operations such as timing synchronization and data demodulation are provided more efficiently.

FIG. 1 is a diagram illustrating a technical structure of a ULP wireless receiver 100 in accordance with an example. The ULP wireless receiver 100 includes an RFIC 102 and a baseband integrated circuit (BBIC) 104, along with interface lines between these elements. The RFIC 102 includes analog components such as, for example, a low noise amplifier (LNA) 110, a first mixer MX1 112, a second mixer MX2 114 including a MX2-I and a MX2-Q, a complex band-pass filter (CBPF) 116, a programmable gain amplifier (PGA) 118 including a PGA-I and a PGA-Q, a direct current offset correct (DCOC) circuit 120, a quadrature envelope detection (QED) circuit 122, and an ADC 124. Here, the components that have I and Q subcomponents use an IQ scheme, which is the cancellation of a signal through two 90° phase shifts to create a 180° phase shift. For example, the ULP wireless receiver 100 is a sliding intermediate frequency (IF) non-coherent receiver.

The BBIC 104 includes a digital logic based AGC and DCOC circuit 115. The AGC and DCOC circuit 115 includes an energy detection (ED) circuit 106, an AGC circuit 108, and a direct current offset estimation (DCOE) circuit. An output from the ADC 124 is input into the AGC circuit 108, the ED circuit 106 and the DCOE circuit. Thus, the AGC circuit 108 includes three outputs. In further detail, the three outputs potentially include a first output $O_1$ used to change a gain of the LNA 110, a second output $O_2$ used to change a gain of the MX2 114, and a third output $O_3$ used to change a gain of the PGA 118. A gain of a component that is able to be varied is referred to as a variable gain. For example, the first output $O_1$ of the AGC circuit 108 is a 2-bit line that is used to select three values of the gain of the LNA 110. In such an example, the second output $O_2$ of the AGC circuit 108 is a 1-bit line that is used to select values of gains of the MX2-I and the MX2-Q elements. Also, in this example, the third output $O_3$ of the AGC circuit 108 is a 6-bit line that is used to select values of the gain of the PGA 118.

An incoming over the air (OTA) signal is received by the ULP wireless receiver 100 and is represented as r(t)=A cos(2πwt)+n(t). Here, n(t) refers to white Gaussian noise with a power spectral density of −174 decibel-milliwatts per hertz (dBm/Hz), and w denotes a center frequency of the signal. In this example, the LNA 110 amplifies the received signal. For example, the gain of the LNA 110 is controlled by the AGC circuit 108 in the BBIC 104, as discussed further above.

After being amplified by the LNA 110, the signal arrives at the first mixer MX1 112. The first mixer MX1 112 multiplies the amplified signal by cos (2πw1t) on a rail on which the MX2-I is present, referred to as a rail I, and by sin (2πw1t) on a rail on which the MX2-Q is present, referred to as a rail Q. In this example, w1 denotes a beating frequency of the MX1 112. Hence, an output of the first mixer MX1 112 ensures that energy of the signal has frequencies (w+w1) and (w−w1). For example, the CBPF 116 rejects a component having the higher frequency (w+w1). Hence, the first mixer MX1 112 modulates the signal from a signal having a radio frequency w to a processed signal having the frequency (w−w1). The second mixer MX2 114 modulates the output signal of the first mixer MX1 112 based on an intermediate frequency w2 for "near baseband" filtering and envelope detection. In further detail, the output signal of the first mixer MX1 112 is multiplied by cos(2πfw2t) on the rail I and by sin(2πfw2t) on the rail Q. Here, w2 denotes a beating frequency of the MX2 114. This modulation of the outputs yields signals having frequencies (w−w1+w2) and (w−w1−w2). Then, a component having the higher frequency (w−w1+w2) is rejected by the CBPF 116. Gains g2-I and g2-Q, which are the gains on the rail I and the rail Q, respectively, are controlled by the AGC circuit 108 based on the second output $O_2$. In an example, on the rail I and the rail Q, the gain of the MX2 114 are the same. Respective outputs of the MX2 114 are then input into the CBPF 116.

The CBPF 116 rejects the signal in frequency bands of (w+w1) and (w−w1). Hence, a center frequency of the CBPF 116 is adjusted to w2.

As shown in the example of FIG. 1, the CBPF 116 is present at a front end. After passing through the second mixer MX2 114, the signal desirably has a frequency of (w−w1−w2) and undesirably has a frequency of (w−w1+w2). Accordingly, a complex filter is implemented to allow only a desirable signal to pass, and to attenuate an image signal by a sufficient margin.

After passing through the CBPF 116, the signals on the rail I and the rail Q are scaled based on the gain of the PGA 118. Here, the gain of the PGA 118 is varied by the AGC circuit 108. These gain values are controlled by the AGC circuit 108 based on the third output $O_3$. Then, the output of the PGA 118 is input into the QED circuit 122, and the QED circuit 122 computes a root mean square value corresponding to $\sqrt{(I^2+Q^2)}$ of the values. In such an example, the QED circuit 122 has a constant gain.

The output of the QED circuit 122 is input into the ADC 124. Then, analog-to-digital conversion is performed by an 8-bit ADC. Such an ADC 124 models the analog signal with a digital approximation for further processing. A sampling rate of the ADC 124 is 3 mega-samples per second (hsps), and an output of the ADC 124 is restricted to an absolute value of 800 millivolts (mV). In further detail, a voltage exceeding 800 mV is decreased to be less than or equal to 800 mV, as a maximum threshold. Moreover, a voltage less than 0 mV is saturated to 0 mV, as a minimum threshold. In response to the analog-to-digital conversion being performed by the 8-bit ADC, the output of the ADC 124 is interpreted to be an 8-bit unsigned integer.

The ADC 124 samples the incoming signal over a time period and quantizes the incoming signal to approximate its amplitude values. Accordingly, the RFIC 102 performs an 8-bit successive approximation register analog-to-digital conversion. During the analog-to-digital conversion, as discussed further, above, the signal is restricted to a range of [0, 800] mV.

In an example, a non-coherent receiver with ternary on-off keying (TOOK) baseband modulation is used. In such a receiver, an input of the ADC 124 is received from the output of the QED circuit 122, which is non-negative as discussed further above. In such an example, the resolution of the ADC 124 is 8 bits, and the input of the ADC 124 is uniformly quantized to 256 levels at its output. However, this is an example and in other examples it is possible to use an ADC 124 with a resolution that differs from 8 bits.

The AGC circuit 108 and DCOC circuit 115 manage an unpredictable nature of the received signal power. For example, in response to the ULP wireless receiver 100 being applied to a body area network (BAN) and a wireless sensor network (WSN), a radio frequency signal power potentially varies from −100 decibel-milliwatts (dBm) to 0 dBm. Accordingly, the AGC circuit 108 maintains a power of an output of a baseband ADC at a near constant power to ensure that successful demodulation and decoding are able to be performed at the BBIC 104.

The AGC circuit 108 is coupled to the ED circuit 106, the DCOE circuit, and sync modules in the BBIC 104. Accordingly, the ED circuit 106 activates the AGC circuit 108. In response to a start of the ULP wireless receiver 100 occurring, the ED circuit 106 then measures a variance in the received output signal of the ADC 124. In such an example, the variance from one interval to the next interval exceeds a predetermined energy detection threshold, for example, 1.5 dB. In response to an increase in an output of the ED circuit 106, the AGC circuit 108 is then activated. Accordingly, in response to a convergence of the AGC circuit 108 and completion of the operation of the DCOE, circuit the sync modules are activated.

For example, the AGC circuit 108 measures an output power of the ADC 124 during each power measurement window. The power measurement window is also potentially referred to as an "AGC loop time" or "AGC window."

Accordingly, the AGC circuit 108 computes the output power of the ADC 124 in dBm, potentially using dedicated hardware or firmware to make the calculation. The AGC circuit 108 stores a gain lookup table (GLUT) in an internal memory thereof. The GLUT is determined offline and does not change from packet to packet. Hence, the GLUT is predetermined to include appropriate values. Also, the AGC circuit 108 is aware of all variable gains of the LNA 110, the MX2 114, and the PGA 118. The AGC circuit 108 also contains values of a target power and a tolerance of the target power. These values are also predetermined appropriately and do not change from packet to packet.

Based on a relationship between the computed output power of the ADC 124 and an SNR, the AGC circuit 108 adjusts a gain of at least one component in the RFIC 102 accordingly. For example, the relationship between the output power of the ADC 124 and the SNR is described in further detail with reference to FIG. 3. A method of adjusting the gain is described in further detail with reference to FIGS. 4A and 4B.

Thus, let $W_n$ denote a window, for example, a time interval, for an $n^{th}$ AGC power measurement iteration, where n=1, 2, or 3. For example, $W_1$=[16, 24] microseconds (μs) in FIG. 2. Here, $P_n$ denotes an output power of the ADC 124 that is measured in dBm units during the window $W_n$. Mathematically, if $X_k$ denotes an output amplitude of the ADC 124 at a discrete time instant k. Equation 1 is then obtained.

$$P_n = 10\log_{10}\left(\frac{\sum_{k=1}^{M} x_k^2/M}{10^{-3}}\right) \quad \text{Equation 1}$$

Accordingly, let $\Delta P_n$ denote the output power of the ADC 124 in $W_n$ as relative to a target power $P_T$. Let $g_n$ denote a total gain during the window $W_n$. Also, let $\Delta g_{(n+1)}$ denote a variance in the total gain. Then, the variance $\Delta g_{(n+1)}$ is determined by the AGC circuit 108 using the GLUT as well as an appropriate gain backoff table (GBT).

FIG. 1 illustrates a limited overview of the ULP wireless receiver 100. However, other examples are not limited thereto the features and aspects of the example of FIG. 1. For example, the ULP wireless receiver 100 optionally includes any number of additional or appropriate replacement components, such as hardware and software components for automatic gain control.

Figure 2:
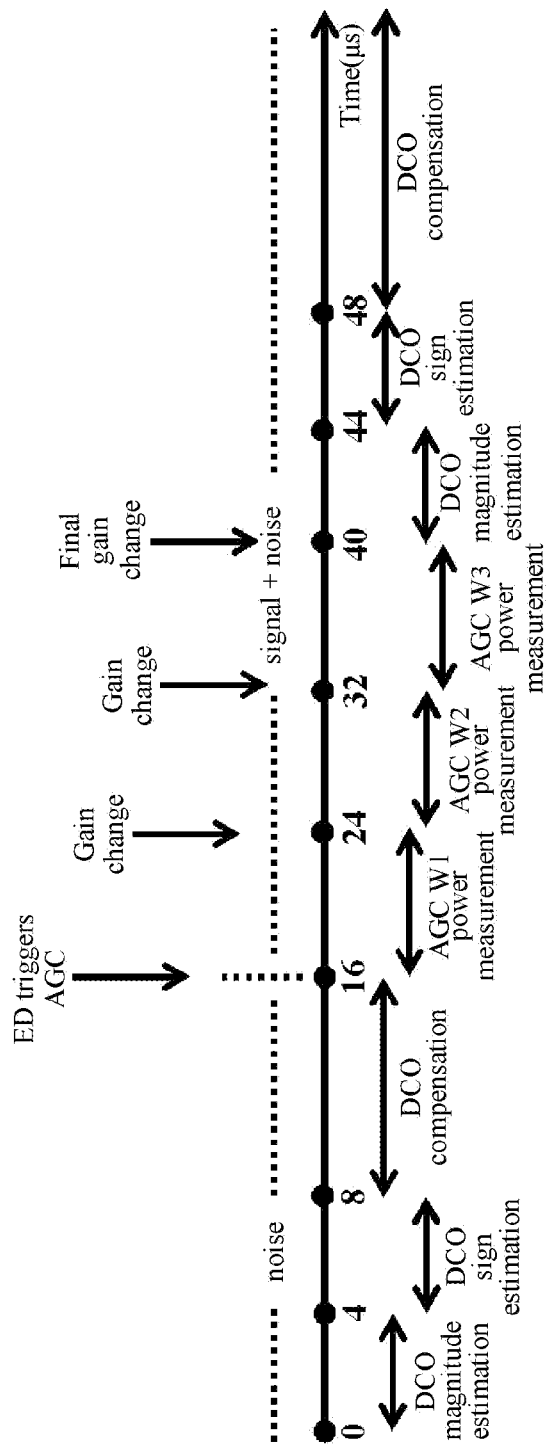
FIG. 2 is a timing diagram of an energy detection circuit, an automatic gain control (AGC) circuit, and an offset compensator based on a header of a received packet in accordance with an example.

FIG. 2 is a timing diagram of the ED circuit 106, the AGC circuit 108, and the DCOC circuit 120 based on a header of a received packet in accordance with an example. For example, in the example of FIG. 2, timing requirements of the AGC circuit 108 for 802.15.4q packets operate during preambles of the 802.15.4q packets. In such an example, a preamble duration is 256 μs, and the AGC circuit 108 converges within first 24 μs of a preamble duration, to ensure an adequate efficiency in DCOC and synchronization operations. Hence, a gain of a component is to be adjusted within first 24 μs of a preamble duration so that the DCOC circuit 120 and the sync modules, in further detail, a frame sync module and a timing sync module, successfully operate for the remaining 232 μs of the preamble duration.

Referring to the example of FIG. 2, it is observable that the AGC circuit 108 is triggered by the ED circuit 106 in response to a signal being received at an antenna of the ULP receiver 100. In response to the AGC circuit 108 being triggered and activated by the ED circuit 106 in this manner, a gain of a component in the RFIC 102 is variable, and the AGC circuit 108 using control bits adjusts a gain of such a component with a variable gain. The AGC circuit 108 measures the output power of the ADC 124 through three successive power measurement windows. In an example, the power measurement windows are windows between 16 and 24 μs, between 24 and 32 μs, and between 32 and 40 μs. The FIG. 2 shows AGC $W_1$, AGC $W_2$, and AGC $W_3$, which correspond to these windows. A power measured in a power measurement window is used to help determine a total gain of the power measurement window. At 40 μs, changes in gains of components are terminated accordingly. As discussed, the AGC circuit 108 performs power measurements during AGC $W_1$, AGC $W_2$ and AGC $W_3$ to change the total gain of the window.

Figure 3:
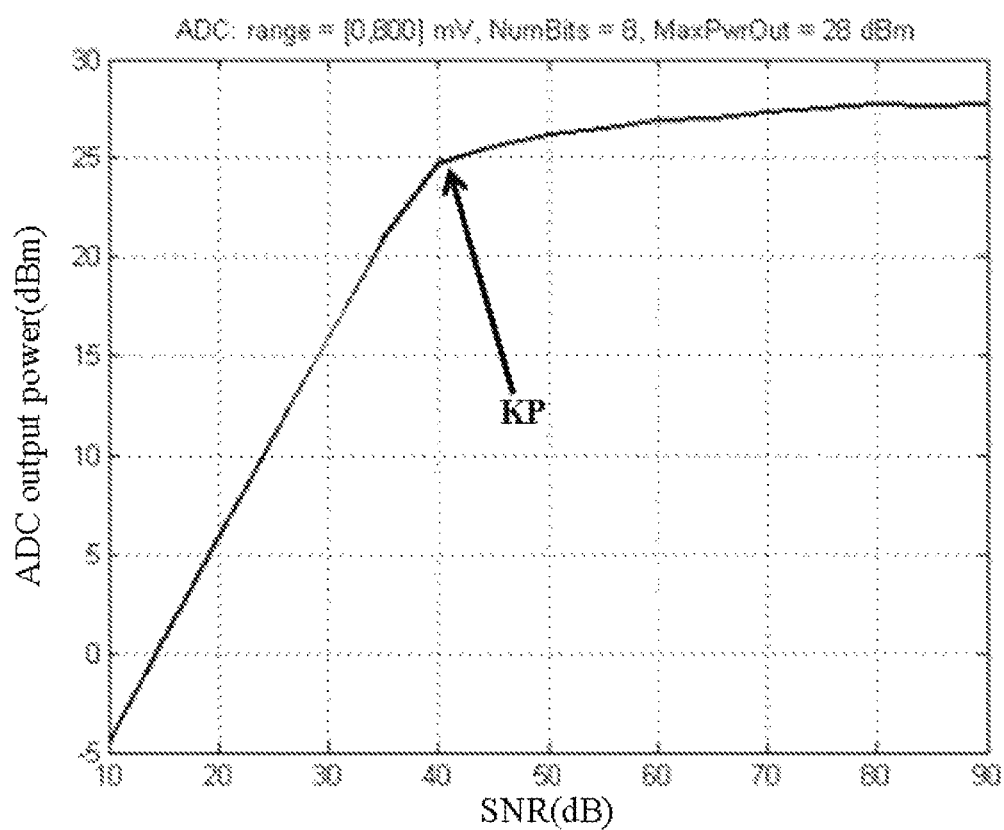
FIG. 3 is a graph illustrating a relationship between an output power of an analog-to-digital converter (ADC) and a signal-to-noise ratio (SNR) received at an antenna of a ULP wireless receiver in accordance with an example.

FIG. 3 is a graph illustrating a relationship between an output power of an ADC and an SNR received at an antenna of a ULP wireless receiver in accordance with an example. Referring to the example of FIG. 3, in response to an incident power of a signal received at the ULP wireless receiver increasing from a lowest value to a highest value, the output power of the ADC varies linearly up to a predetermined point, for example, a knee point (KP). Such a KP refers to a point at which such linearity no longer continues. The output power of the ADC then increases in a concave manner. In this example, the SNR is calculated based on the signal received at the antenna of the ULP wireless receiver. The output signal of the ADC requires an adequate SNR for successful demodulation and decoding.

In an example, the power of the output signal of the ADC is measured in dBm using the dedicated hardware or firmware. Furthermore, in such an example, the target power to be achieved by the AGC circuit 108 is equal to or very close to the KP.

From the example of FIG. 3, two main patterns are observable. First, the output power of the ADC varies linearly with the SNR as the SNR increases up to 40 dB. Second, in response to the SNR exceeding 40 dB, the output power of the ADC varies as a concave function of the SNR. Hence, an adjustment of the gain in the RFIC is performed based on the above two observations. For example, a reduction in the gain of the RFIC 102 is chosen based on the second pattern, whereas an increase in the gain of the RFIC 102 is chosen based on the first pattern.

Figure 4A:
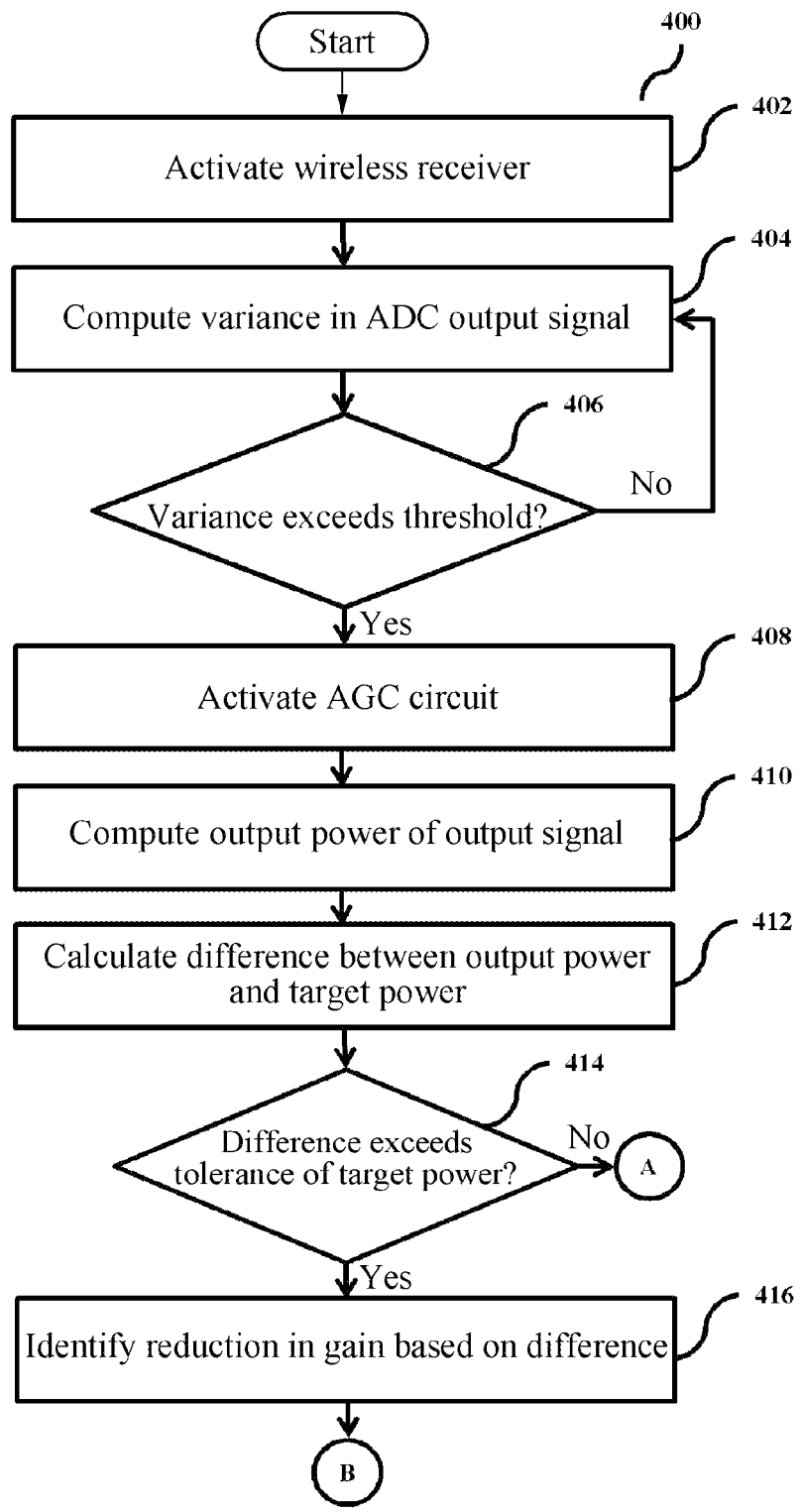

FIGS. 4A and 4B are flowcharts illustrating a method 400 of performing AGC in a ULP wireless receiver in accordance with an example.

Referring to the example of FIGS. 4A and 4B, in operation 402, the ULP wireless receiver 100 is activated. In response to the ULP wireless receiver 100 being activated, the ED circuit 106 measures a variance in an output signal of the ADC 124, and hence this operation leads to such a measurement in operation 404.

In operation 404, the method 400 computes a variance in the output signal of the ADC 124 for a plurality of consecutive windows. For example, a length of the consecutive windows used to measure the variance is 4 μs. However, it is possible to use windows of a different length in another example. In this example, the consecutive windows are primarily used for variance measurement.

In operation 406, the method 400 determines whether the variance exceeds a threshold. In response to the variance exceeding the threshold, an output value of the ED circuit 106 increases and the ED circuit 106 activates the AGC circuit 108 as described in operation 408, below. In response to the variance not exceeding the threshold, operation 404 is repeated and the variance in the ADC output signal is computed again.

In operation 408, the method 400 activates the AGC circuit 108. Accordingly, in the ULP wireless receiver 100, to reduce power consumption, the components of the BBIC 104 are activated in response to a presence of an information signal being confirmed. In an example, the components of the BBIC 104 include the AGC circuit 108, the timing sync module, the frame sync module, a demodulator, and a decoder. However, examples are not limited thereto, and other examples include appropriate additional or alternative elements.

In operation 410, the method 400 computes an output power of the ADC 124. Here, all variable gains of the components in the RFIC 102 are maintained at their highest values. Subsequently, the AGC circuit 108 decreases or increases the variable gains of the components to set the output power of the ADC 124 to a desired value for effective baseband demodulation, based on the computed output power.

In operation 412, the method 400 computes a difference between the output power of the output signal and a target power. Hereinafter, such a difference is referred to simply as the power difference. Hence, the output power is quantized using the target power. Accordingly, as long as the AGC circuit 108 is activated, in further detail, in response to the gains of the components being variable, the variable gains are to be periodically and appropriately changed at the LNA 110, the MX2 114, and the PGA 118 so as to ensure that the output power remains close to the target power. Hence, ideally, even if there are variations in the received signal, the target power is achieved by varying a total gain.

It is to be understood that the target power is possibly not achieved for relatively low values of radio frequency power at the antenna of the ULP wireless receiver 100, even if all variable gains are at their maximum values. For example, in a case in which a received power is −94 dBm and a total gain is 91 dB, the output power of the ADC 124 is potentially about −3 dBm. This value is insufficient for demodulating a baseband on-off keying (OOK) signal, even if the variable gains are maximized.

In operation 414, the method 400 determines whether the power difference exceeds a tolerance of the target power. In an example in which the target power of the ADC 124 is 21 dBm, with the intention of providing a headroom for adjacent channel interference (ACI) and alternate channel interference (ALCI), the tolerance of the target power ensures that the AGC circuit 108 does not frequently change the gains for minor changes in the output power of the ADC 124.

In operation 416, the method 400 identifies a reduction in the gain based on a result of the determining. In response to the power difference exceeding the tolerance of the target power, the AGC circuit 108 identifies the reduction in the gain. For example, a gain of at least one component of the RFIC 102 is adjusted accordingly based on the reduction in the gain.

The reduction in the gain is identified by mapping a power difference interval to the reduction in the gain. For example, a GBT maps the power difference interval to the reduction in the gain, under a condition that the power difference exceeds the tolerance of the target power. An example of a GBT is shown in Table 1.

TABLE 1

GBT for sliding IF non-coherent receiver

| Variance in output power | Change in total gain (dB) |
| --- | --- |
| (1.5, 3.0] | −5 |
| (3.0, 4.0] | −15 |
| (4.0, 4.8] | −25 |
| (4.8, 5.5] | −35 |
| (5.5, 6.1] | −40 |
| (6.1, 6.6] | −50 |
| (6.6, 7.0] | −60 |

The GBT is based on an inverse of the function that maps the SNR to the output power of the ADC 124, as shown in FIG. 3. In a practical example, the GBT is constructed offline manually during the calibration phase of the ULP wireless receiver 100 to include predetermined values that lead to proper operation. In response to the reduction in the gain in the RFIC 102 being identified, the overall gain of the RFIC 102 is also adjusted using a GLUT.

Furthermore, the GBT is constructed by mapping the SNR to the power difference interval corresponding to the difference between the output power and the target power. Hence, the GBT is constructed based on a graph illustrating a relationship between the output power and the SNR. To construct the GBT and identify the reduction in the gain, the graph has a shape of a concave function, which, in further detail, is restricted beyond the KP. Once the graph is restricted, intervals are uniformly spaced along an axis of SNR. In response to the intervals being spaced accordingly, reverse-mapping is performed to convert the uniformly spaced intervals to non-uniformly spaced intervals along an axis of the output power. In this manner, power difference intervals corresponding to SNR intervals are obtained. The non-uniform intervals relative to the target power are calculated to compute the reduction in the gain. A target SNR is proportional to a zero value of the power difference. Thus, for each row in the table, a reduction in the total gain is determined as an SNR difference between a midpoint of the uniform intervals on a horizontal axis and the target SNR.

In operation 418, the method 400 adjusts the gain of the at least one component based on the reduction in the gain that was determined in operation 416. For example, the gain of the at least one component in the RFIC 102 is adjusted based on an unquantized gain computed by adding a sum of current quantized gains and an identified reduction in the gain. Based on the unquantized gain, values of the gains of the components are selected from a GLUT, and the values of the gains are adjusted accordingly. The unquantized gain is computed by adding a variable gain of the at least one component and a fixed gain of the at least one component.

The GLUT obtained as discussed above is employed by the AGC circuit 108 to determine values of variable gains for a fixed value of the total unquantized gain. For example, for a total unquantized gain of 100 dB, gains of the LNA 110, the MX2 114, and the PGA 118 are 21 dB, 12 dB, and 34.5 dB, respectively. However, gains of the MX1 112, the CBPF 116, and the QED circuit 122 remain fixed at 9.5 dB, 8 dB, and 15 dB, respectively. Thus, the cumulative value of all constant gains is 32.5 dB. A snapshot of the GLUT for total gain values ranging from 30 dB to 100 dB in steps of 10 dB is shown in Table 2. To adjust these gains, the AGC circuit 108 selects a row in the GLUT in which a total gain value has a minimum absolute difference with the total unquantized gain. Based on the values of the LNA 110, the MX2 114, and the PGA 118, the gains of the corresponding components are adjusted accordingly.

TABLE 2

GLUT used by AGC circuit 108
Gain in dB

| Total | LNA | MX1 | MX2 | CBPF | PGA | QED |
|---|---|---|---|---|---|---|
| 30.25 | −3 | 9.5 | 0 | 8 | 0.75 | 15 |
| 40 | −3 | 9.5 | 0 | 8 | 10.5 | 15 |
| 50.5 | 9 | 9.5 | 0 | 8 | 9 | 15 |
| 60.25 | 21 | 9.5 | 0 | 8 | 6.75 | 15 |
| 70 | 21 | 9.5 | 12 | 8 | 4.5 | 15 |
| 80.5 | 21 | 9.5 | 12 | 8 | 15 | 15 |

Total gains are computed by adding the cumulative fixed gain to all possible values of variable gains. For example, in the GLUT, the rows are sorted in an ascending order of total gain. A certain value of the total gain is then mapped to multiple variable gains of a plurality of components. For example, such a total gain is mapped to the LNA 110, the MX2 114, and the PGA 118. In such an example, in response to the total gain being 46 dB, the variable gains have sequences of values as follows:

LNA gain=−3 dB, MX2 gain=0 dB, PGA gain=16.5 dB
LNA gain=−3 dB, MX2 gain=12 dB, PGA gain=4.5 dB
LNA gain=9 dB, MX2 gain=0 dB, PGA gain=4.5 dB To resolve such issues and determine how to control operation properly, a "row sorting" method is used for multiple solutions or rows corresponding to the same value of the total gain to determine which row's settings to use.

Hence, priorities are assigned to the components to reduce a noise figure (NF). Further, a variable gain associated with at least one component is selected based on the assigned priorities. The method prioritizes a row which has a highest value of a gain of a front-most component. The variable gain associated with the at least one component is then selected based on a priority assigned to each component. Such a priority is assigned to reduce the noise figure.

The variable gains are sorted and selected in such a way that the noise figure is minimized. For example, the Friis' equation for the total noise figure of cascaded stages is expressed by Equation 3, in which LNA, MX1, MX2, and PGA denote the LNA 110, the MX1 112, the MX2 114, and the PGA 118, respectively. The Friis transmission equation is used in telecommunications engineering, and gives the power received by one antenna under idealized conditions given another antenna some distance away transmitting a known amount of power.

$$NF_{system} = NF_{LNA} + \frac{NF_{MX1} - 1}{g_{LNA}} + \frac{NF_{MX2} - 1}{g_{LNA}g_{MX1}} + \frac{NF_{PGA} - 1}{g_{LNA}g_{MX1}g_{MX2}} \quad \text{Equation 3}$$

Hence, for a lower system NF value, the gain of the LNA 110 is set to be at a maximum value. Next, the gain of the MX2 114 is also set to be at a maximum value. The foregoing approach is applied to the MX2 114 and the PGA 118. To reduce the system NF value, a method of sorting multiple rows in the GLUT is provided. In further detail, rows are sorted in a descending order corresponding to the gain of the LNA 110. In a case in which two or more rows have the same gain of the LNA 110, the rows are sorted in a descending order of the gain of the MX2 114 as a "tie-breaker". Accordingly, a top row is selected in the GLUT.

TABLE 3

Rows for total gain of 76 dB being sorted in GLUT
Gain in dB

| Total | LNA | MX1 | MX2 | CBPF | PGA | QED |
|---|---|---|---|---|---|---|
| 76 | 21 | 9.5 | 12 | 8 | 10.5 | 15 |
| 76 | 21 | 9.5 | 0 | 8 | 22.5 | 15 |
| 76 | 9 | 9.5 | 12 | 8 | 22.5 | 15 |
| 76 | 9 | 9.5 | 0 | 8 | 34.5 | 15 |
| 76 | −3 | 9.5 | 12 | 8 | 34.5 | 15 |

In operation 420, the method 400 determines whether the power difference value is less than or equal to a negative value of the tolerance. In response to the output power being less than the target power, the AGC circuit 108 induces the output power of the ADC 124 to become closer to the target power by increasing the gain in the RFIC 102.

In operation 422, the method 400 identifies an increase in the gain based on the calculated power difference. For example, in response to the power difference being less than or equal to the negative value of the tolerance of the target power, the AGC circuit 108 identifies the appropriate increase in the gain in the RFIC 102. The appropriate increase in the gain is derived as being proportional to the power difference. Based on the identified increase in the gain, the AGC circuit 108 then retrieves the gain values of the components with appropriate variable gains from the GLUT.

In operation 424, the method 400 adjusts the gain of the at least one component whose variable gain has been determine to require adjustment. Based on the total increase in the gain and values of gains of components selected from the GLUT, the values of the gains of the components are adjusted accordingly.

In operation 426, the method 400 repeats operations 410 to 424 for a maximum of three iterations. Hence, the repetition improves overall performance by adjusting gains iteratively. However, the maximum of three iterations applies to one example, and in other example different maximum numbers of iterations are possibly applicable, although other appropriate operational adjustments are possibly required in these examples. Thus, the gains of the components are varied in response to the signal received at the ULP wireless receiver 100. Table 4 shows an example configuration of adjusting gains using the AGC circuit 108.

TABLE 4

Gain adjustment

| AGC window | Time interval | Measured output power (dBm) | Total gain (dB) | Gain vector (dB) | AGC action |
|---|---|---|---|---|---|
| $W_1$ | [16, 24) μs | 21.8 | 103 | [21 12 37.5] | No gain change |
| $W_2$ | [24, 32) μs | 24.4 | 103 | [21 12 37.5] | Reduce total gain by 15 dB |
| $W_3$ | [32, 40) μs | 11.3 | 88 | [21 12 22.5] | Increase total gain by 9 dB |
| — | 40 μs onwards | — | 97 | [21 12 31.5] | Gains locked |

The performance of the AGC circuit 108 for an SNR of 40 dB is observable from the above discussion. For example, from FIG. 2, it is observable that the AGC circuit 108 is activated from 16 μs to 40 μs, and it is activated during 3 successive power measurement windows. After 40 μs, the output of the ADC 124 overlaps with an input of the ADC 124.

As shown in the example of Table 5, system parameters are used for illustrating the impact and effect of the use of the AGC for different SNRs.

TABLE 5

System parameters for AGC

| System parameter | Value |
|---|---|
| Modulation scheme | 1/1 TOOK |
| Noise only interval | [0, 16] μs |
| Header interval (incl. preamble) | [16, 272] μs |
| SFD interval | [272, 336] μs |
| Data (payload) interval | [336, 502] μs |
| AGC target power at ADC output | 21 dBm |
| Target power tolerance | 1.5 dB |
| Number of AGC iterations (windows) | 3 |

In a first AGC window $W_1$ spanning [16, 24) μs, the power of the output signal is measured at 21.8 dBm and the power difference is 0.8 dBm, which is within a tolerance of 1.5 dB. Hence, the AGC circuit 108 does not change the gain values and proceeds with a subsequent power measurement window.

In a second AGC window $W_2$ spanning [24, 32) μs, the power of the output signal is measured at 24.4 dBm. Relative to the target power, the power difference corresponds to 3.4 dB, which is higher than the predetermined tolerance. As shown in the third row of Table 1, the total gain is to be reduced by 15 dB. The new value of the total gain is 88 dB. From the GLUT, the closest match to 88 dB is the entry for [LNA, MX2, PGA]=[21 12 22.5] dB. Since the gains of the LNA 110 and the MX2 114 are already at 21 dB and 12 dB, respectively, the gain of the PGA 118 is then decreased to 22.5 dB to match the appropriate value from the table. The AGC circuit 108 then proceeds with a subsequent power measurement window.

In a third AGC window $W_3$ spanning [32, 40) μs, the output power is measured at 11.3 dBm. Relative to the target power, the power difference is −9.7 dB, which is a value less than the tolerance value of 1.5 dB. Hence, the total gains are to be increased by Δg=[9.7]=9 dB. From the GLUT, the closest match to 97 dB is [LNA, MX2, PGA]=[21, 12, 31.5] dB. Hence, the gain of the PGA 118 is increased to 31.5 dB accordingly.

Figure 5A:
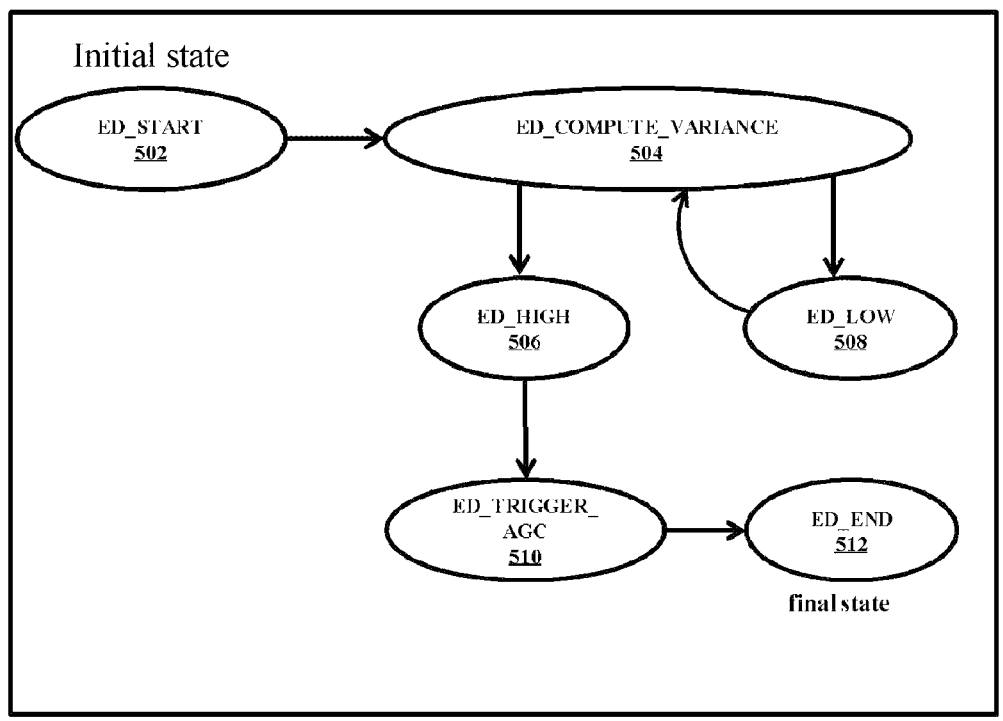
FIGS. 5A and 5B are state diagrams of an energy detection circuit and an AGC circuit, respectively, in accordance with an example.
Figure 5B:
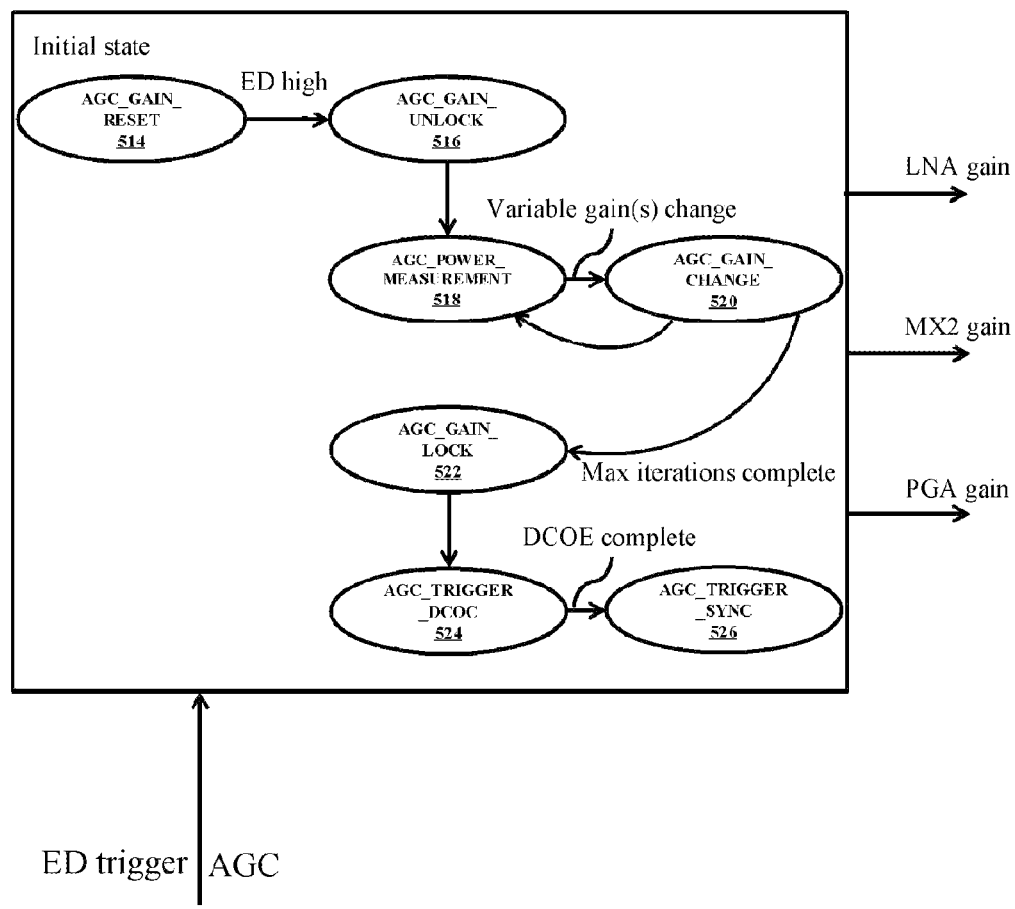

FIGS. 5A and 5B are state diagrams of the ED circuit 106 and the AGC circuit 108, respectively, in accordance with an example. In ED_START operation 502, the ED circuit 106 starts up in response to the ULP wireless receiver 100 being turned on.

FIG. 5A illustrates the state diagram of the ED circuit 106. In ED_COMPUTE_VARIANCE operation 504, the ULP wireless receiver 100 is turned on and the ED circuit 106 then measures a variance in an output signal. In response to a difference in the variance for a plurality of consecutive windows exceeding a threshold value, the output of the ED circuit 106 has a high value in ED_HIGH operation 506. Alternatively, in response to the variance being less than the threshold value, the output of the ED circuit 106 has a low value in ED_LOW operation 508, and the ED circuit 106 continuously measures the variance in the output signal. In ED_TRIGGER_AGC operation 510, the ED circuit 106 triggers the operation of the AGC circuit 108. Then, in ED_END operation 512, the ED unit 106 is turned off.

FIG. 5B illustrates the state diagram of the AGC circuit 108. In AGC_GAIN_RESET operation 514, the AGC circuit 108 is in an initial state until an ED_HIGH input control signal is received from the ED circuit 106, which is produced under certain conditions as discussed above. In response to an increase in the output of the ED circuit 106, gains controlled by the AGC circuit 108 are unlocked in AGC_GAIN_UNLOCK operation 516. Also, in AGC_POWER_MEASURMENT operation 518, the AGC circuit 108 measures an output power of the ADC 124 with respect to the received signal. Furthermore, in AGC_GAIN_CHANGE operation 520, the gains of the components in the RFIC 102 are also allowed to change at an end of each power measurement window. In response to a maximum number of iterations of power measurement being performed in AGC_GAIN_LOCK operation 522, the gains of the components are locked. In AGC_TRIGGER_DCOC operation 524, the AGC circuit 108 triggers the DCOC circuit 120. Finally, in AGC_TRIGGER_SYNC operation 526, the AGC circuit 108 triggers the sync modules in the BBIC 104.

Figure 6:
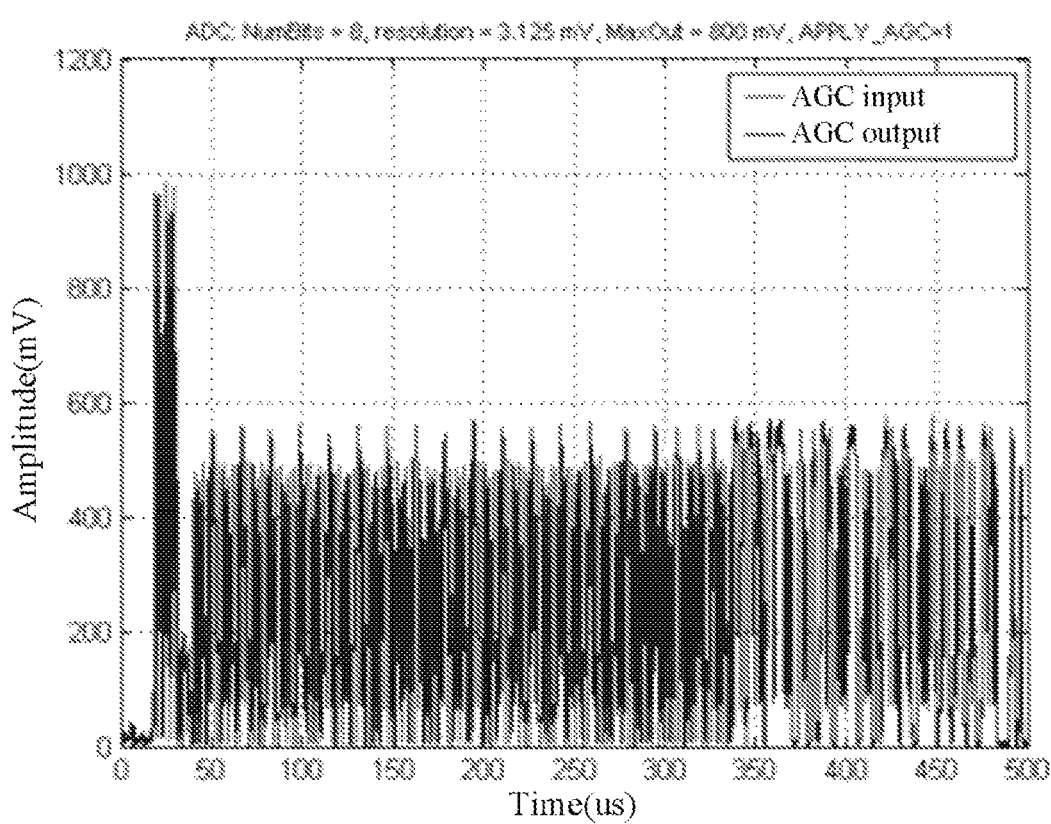
FIG. 6 is a graph illustrating relationships between an input signal and an output signal of an ADC and a demodulation time of a packet received using an AGC mechanism in accordance with an example.

FIG. 6 is a graph illustrating an input signal and an output signal of an ADC with respect to time.

From the example of FIG. 6, it is observable that the AGC circuit 108 achieves a target power of 21 dBm. Furthermore, the AGC circuit 108 ensures that a signal does not clip, leading to successful baseband demodulation. Here, clipping is distortion that occurs when signals exceed a threshold are cut off and hence do not accurately reflect all of the information that would otherwise be included in the signal.

Monte Carlo simulations are used to evaluate the performance of a PHY layer in FIG. 1. In this example, the performance metric that is used is a packet error rate (PER).

For example, system parameters for regression simulations in examples are shown in Table 6.

TABLE 6

System parameters for AGC operation

| System parameter | Value |
| --- | --- |
| ADC sampling rate | 3 Msps |
| Chip rate | 1 Mcps |
| Signal center frequency | 80 MHz |
| Mixer-1 frequency | 64 MHz |
| Mixer-2 frequency | 14.7 MHz |
| Center frequency of CBPF | 1.3 MHz |
| Number of data (payload) bits | 160 |
| Spreading factor of header (incl. preamble) | 8 |
| Duration of noise-only interval before packet | 16 μs |
| ADC resolution | 8 bits |
| AGC target power at ADC output | 21 dBm |
| Target power tolerance | 1.5 dB |
| Power spectral density of AWGN | −174 dBm/Hz |

Figure 7:
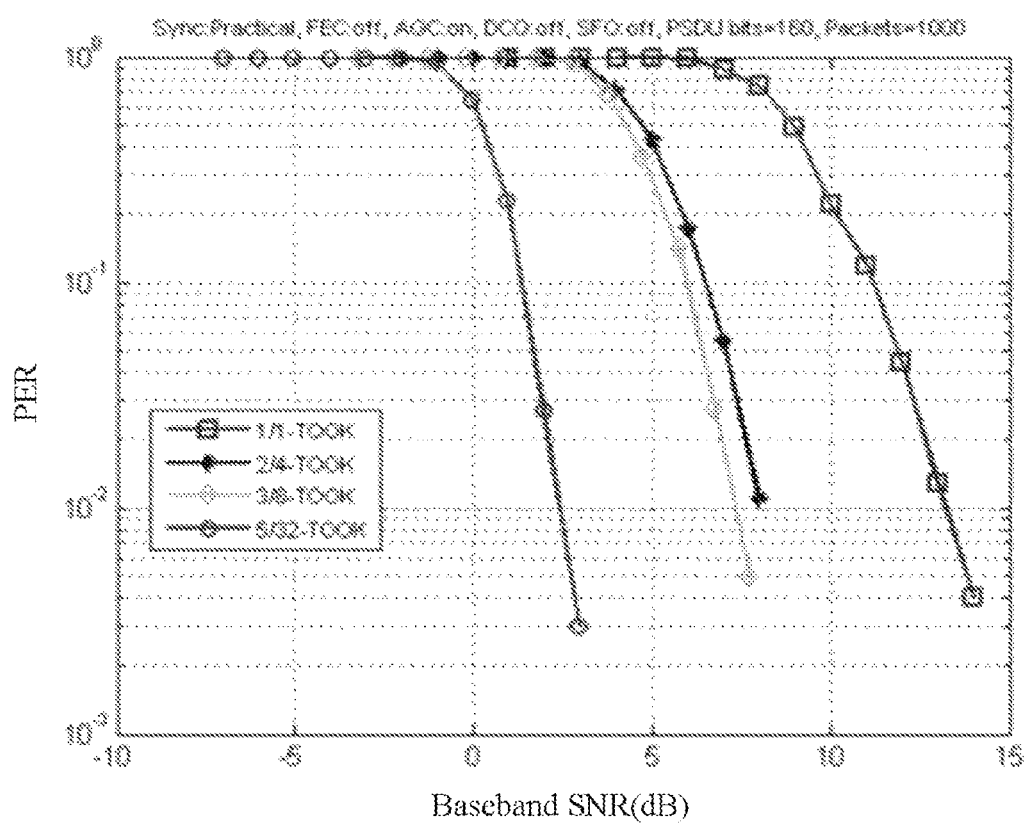
FIG. 7 is a graph illustrating a relationship between a packet error rate (PER) and a baseband SNR of a ULP wireless receiver used in wireless personal area networks (WPANs) in accordance with an example.

FIG. 7 illustrates a performance of a sliding IF receiver for all data rates D1, D2, D3 and D6 in response to the AGC circuit 108 being activated, according to an example.

Table 7 shows sensitivity values for 1% PER without FEC and interleaving.

TABLE 7

Sensitivity values for 1% PER

| Data rate | Baseband sensitivity |
| --- | --- |
| 1/1 TOOK (D1) | 13.5 dB |
| 2/4 TOOK (D2) | 8 dB |
| 3/8 TOOK (D3) | 7 dB |
| 5/32 TOOK (D6) | 2.5 dB |

Figure 8:
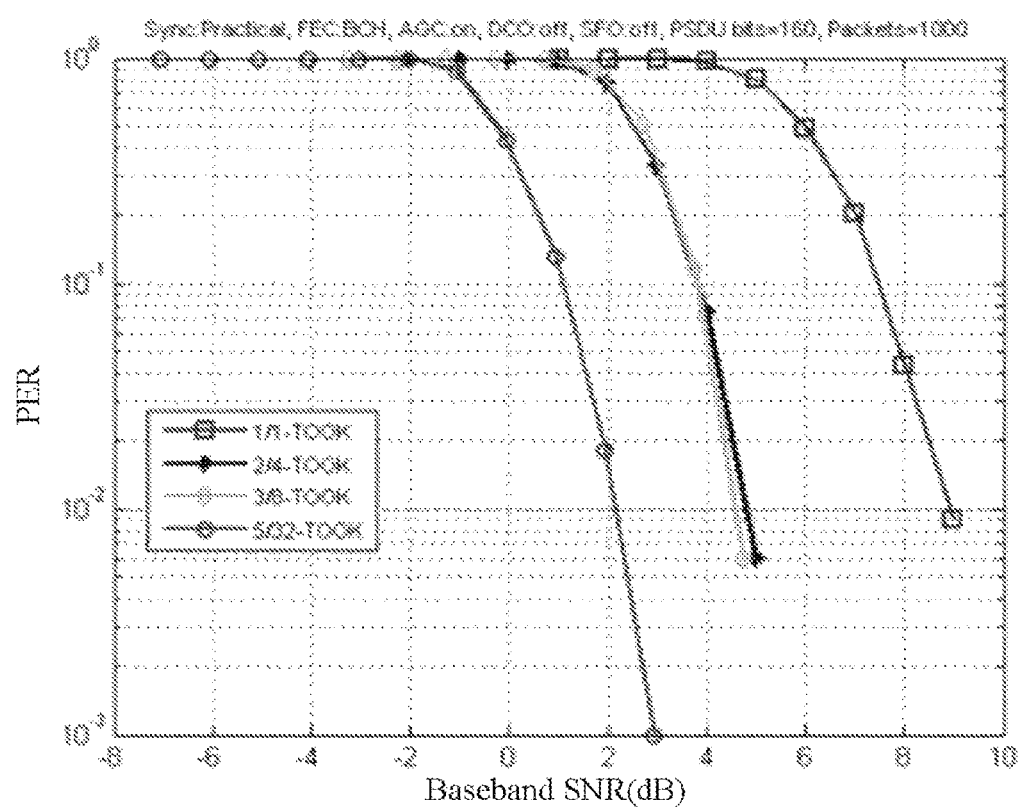
FIG. 8 is a graph illustrating a relationship between a PER and a baseband SNR of a wireless receiver in a case in which forward error correction (FEC) and interleaving are considered, in accordance with an example.

FIG. 8 is a graph illustrating a relationship between a PER and a baseband SNR in a cases in which FEC and interleaving are applied, according to an example.

Table 8 shows the corresponding sensitivity values.

TABLE 8

Sensitivity values with FEC and interleaving

| Data rate | Sensitivity at digital baseband |
| --- | --- |
| 1/1 TOOK (D1) | 9 dB |
| 2/4 TOOK (D2) | 47 dB |
| 3/8 TOOK (D3) | 4.3 dB |
| 5/32 TOOK (D6) | 3.3 dB |

Figure 9:
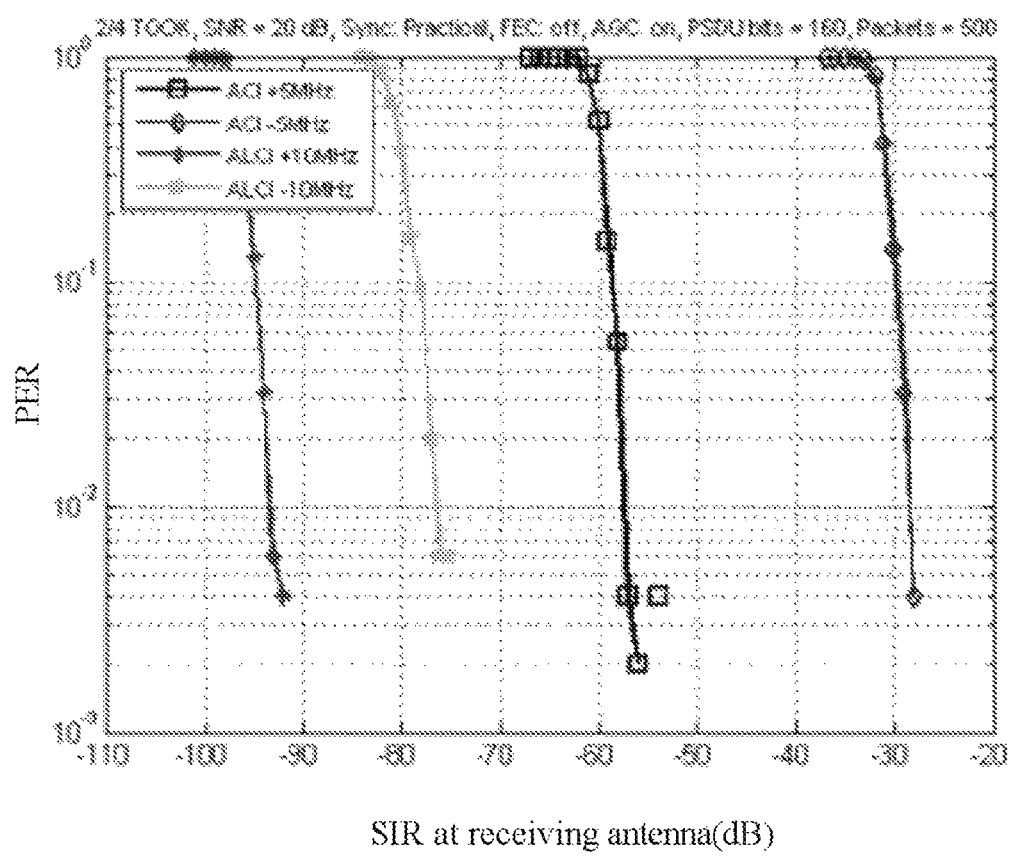
FIG. 9 is a graph illustrating a relationship between a PER and a signal-to-interference ratio (SIR) in accordance with an example.

FIG. 9 is a graph illustrating a relationship between a PER and a signal-to-interference ratio (SIR), according to an example. FIG. 9 shows ACI and ALCI performance for data rate D2. Based on the relationship between the PER and the SIR, an ACI and ALCI rejection ratio is determined appropriately, as discussed further below.

ACI is defined as interference that is 5 MHz away from a center frequency of an intended signal. Thus, for a signal having a center frequency of 80 MHz, ACI has a center frequency of 75 MHz or 85 MHz. ALCI is defined as interference that is 10 MHz away from a center frequency of a signal, and is measured accordingly. To quantify a maximum tolerable interference power for a power of a signal within a given data rate, a fixed value of the power of the signal is set to be 3 dB higher than a receiver sensitivity. Therefore, to determine the ACI or ALCI rejection ratio, an SNR is fixed and then an SIR is increased until the PER is less than 1%. After this increase has occurred, the rejection ratio is then defined as a negative of the SIR. For example, a desired signal has an SNR of 20 dB. Accordingly, an undesired interference signal with data rate D6 of 5/32 TOOK has a higher power than the desired signal at a receiving antenna. For ACI being −5 MHz away from the signal, a center frequency of the ACI is fixed to 75 MHz, as discussed above. Starting from a low value of an SIR, the SIR is increased until the PER is less than 1%. The PER is caused to be less than 1% in response to the increase in the SIR. From the drawings, it is observable that in response to the ACI being at 75 MHz, the PER is less than 1% at an SIR of −28 dB. This indicates that the rejection ratio for an interference center frequency of 75 MHz is derived to be 28 dB. Similarly, the rejection ratio for an interference center frequency of 85 MHz is derived to be 57 dB. Accordingly, the ACI rejection ratio is set to be a minimum value of these values, in this particular example, 28 dB. Similarly, the ALCI rejection ratio is 76 dB, and it is derived in a similar manner. These rejection ratios are listed in Table 9.

TABLE 9

Rejection ratios for 2/4 TOOK signal and 5/32 TOOK interference

| | Sliding IF simulator | 802.15.4 standard |
| --- | --- | --- |
| ACI rejection ratio (dB) | 28 | 0 |
| ALCI rejection ratio (dB) | 76 | 20 |

Figure 10:
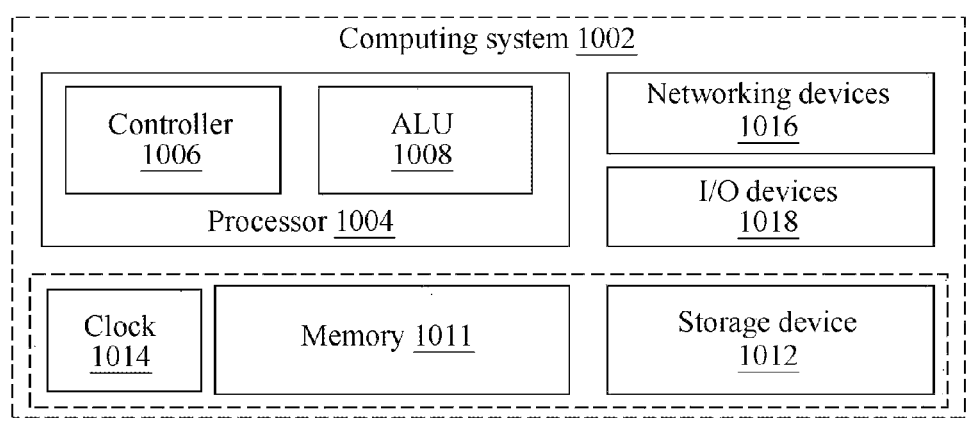
FIG. 10 is a block diagram illustrating a computing system that implements a method and apparatus for performing AGC in accordance with an example.

FIG. 10 illustrates a computing system 1002 that implements a method and apparatus for performing AGC in an ULP wireless receiver. Referring to the example of FIG. 10, the computing system 1002 includes at least one processor 1004 that is equipped with a controller 1006, an arithmetic logic unit (ALU) 1008, a memory 1011, a storage device 1012, a clock 1014, a plurality of networking devices 1016, and a plurality of input/output (I/O) devices 1018. The processor 1004 is configured to perform an algorithm, and to receive commands from the controller 1006 to perform the algorithm. The ALU 1008 is configured to perform logical and arithmetic operations involved in the performance of the algorithm, as part of the operation of the processor 1004. The overall computing system 1002 possibly includes multiple homogeneous or heterogeneous cores, different types of multiple CPUs, special media, and other accelerators or processing devices, such as specialized graphics processor or the like. A plurality of processors 1004 is possibly disposed on a single chip or a plurality of chips. The algorithm is stored in at least one of the memory 1011 and the storage device 1012. The commands are fetched from at least one of the memory 1010 and the storage device 1012, and executed by the processor 1004. The processor 1004 synchronizes operations and executes the commands based on timing signals generated by the clock 1014. Alternatively, the algorithm is performed by a specialized processor or processors specifically adapted to perform aspect of the algorithm.

The apparatuses, units, modules, devices, and other components illustrated in FIGS. 1-10 that perform the operations described herein with respect to FIGS. 1-10 are implemented by hardware components. Examples of hardware components include controllers, sensors, generators, drivers, memories, comparators, arithmetic logic units, adders, subtractors, multipliers, dividers, integrators, and any other electronic components known to one of ordinary skill in the art. In one example, the hardware components are implemented by computing hardware, for example, by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 1-10. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-10 that perform the operations described herein with respect to FIGS. 1-10 are performed by a processor or a computer as described above executing instructions or software to perform the operations described herein.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of performing automatic gain control (AGC) in a wireless receiver, the method comprising:
   computing, by an energy detection (ED) circuit, a variance in an output signal of an analog-to-digital converter (ADC);
   activating, by the ED circuit, an AGC circuit to adjust a gain of a component in a radio frequency integrated chip (RFIC) in response to the variance exceeding a threshold;
   computing, by the AGC circuit, an output power of the output signal; and
   adjusting, by the AGC circuit, the gain of the component based on a relationship between the output power and a signal-to-noise ratio (SNR) of a received signal,
   wherein the adjusting further comprises
   calculating a difference between the output power and a target power of the output signal,
   determining whether the difference exceeds a tolerance of the target power,
   identifying a reduction in the gain based on a result of the determining, and
   adjusting the gain of the component based on the reduction in the gain.

2. The method of claim 1, wherein the identifying comprises mapping a power difference interval to the reduction in the gain.

3. The method of claim 2, wherein the mapping comprises:

obtaining a power difference interval corresponding to an SNR interval;

subtracting an intermediate value of the SNR interval from a target SNR; and identifying the reduction in the gain for the power difference interval based on a result of the subtracting.

4. The method of claim 1, further comprising:

identifying an increase in the gain based on the result of the determining; and adjusting the gain of the component based on the increase in the gain.

5. The method of claim 1, wherein the adjusting comprises computing an unquantized gain by adding a sum of current quantized gains and the reduction in the gain.

6. The method of claim 5, wherein the computing of the unquantized gain comprises adding a variable gain of the component and a fixed gain of the component.

7. The method of claim 6, further comprising:

assigning a priority to the component to reduce a noise figure; and selecting the variable gain of the component based on the priority.

8. The method of claim 6, wherein the component with a variable gain comprises at least one of a low noise amplifier (LNA), a mixer, a filter, a programmable gain amplifier (PGA), and an envelope detector.

9. A wireless receiver comprising:

an energy detection (ED) circuit configured to compute a variance in an output signal of an analog-to-digital converter (ADC), and to activate an automatic gain control (AGC) circuit in response to the variance exceeding a threshold, wherein the AGC circuit is configured to adjust a gain of a component in a radio frequency integrated chip (RFIC), wherein the AGC circuit is further configured to compute an output power of the output signal, adjust the gain of the component based on a relationship between the output power and a signal-to-noise ratio (SNR) of a received signal, calculate a difference between the output power and a target power of the output signal, determine whether the difference exceeds a tolerance of the target power, identify an increase in the gain based on a result of the determining, and adjust the gain of the component based on the increase in the gain.

10. The wireless receiver of claim 9, wherein the AGC circuit is further configured to:

identify a reduction in the gain based on result of the determining; and adjust the gain of the component based on the reduction in the gain.

11. The wireless receiver of claim 10, wherein the AGC circuit is configured to identify the reduction in the gain by mapping a power difference interval to the reduction in the gain.

12. The wireless receiver of claim 11, wherein the AGC circuit is further configured to:

obtain a power difference interval corresponding to an SNR interval;

subtract an intermediate value of the SNR interval from a target SNR; and identify the reduction in the gain for the power difference interval based on a result of the subtracting.

13. The wireless receiver of claim 10, wherein the AGC circuit is further configured to compute an unquantized gain by adding a sum of current quantized gains and the reduction in the gain.

14. The wireless receiver of claim 13, wherein the AGC circuit is configured to compute the unquantized gain by adding a variable gain of the component and a fixed gain of the component.

15. The wireless receiver of claim 14, wherein the AGC circuit is configured to assign a priority to the component to reduce a noise figure, and select the variable gain of the component based on the priority.

16. A non-transitory computer-readable storage medium storing instructions that, when executed by a processor, cause the processor to perform a method comprising:

computing, by an energy detection (ED) circuit, a variance in an output signal of an analog-to-digital converter (ADC); and activating, by the ED circuit, an AGC circuit to adjust a gain of a component in a radio frequency integrated chip (RFIC) in response to the variance exceeding a threshold;

computing, by the AGC circuit, an output power of the output signal; and adjusting, by the AGC circuit, the gain of the component based on a relationship between the output power and a signal-to-noise ratio (SNR) of a received signal, wherein the adjusting further comprises calculating a difference between the output power and a target power of the output signal, determining whether the difference exceeds a tolerance of the target power, identifying a reduction in the gain based on a result of the determining, and adjusting the gain of the component based on the reduction in the gain.

* * * * *